United States Patent [19]

Battarel

[11] 4,250,566

[45] Feb. 10, 1981

[54] MAGNETIC DOMAIN PROPAGATION REGISTER

[75] Inventor: Claude Battarel, Magagnosc, France

[73] Assignee: Crouzet, Paris, France

[21] Appl. No.: 948,417

[22] Filed: Oct. 4, 1978

[30] Foreign Application Priority Data

Oct. 12, 1977 [FR] France ................................. 77 30804

[51] Int. Cl.³ ............................................. G11C 19/08
[52] U.S. Cl. ....................................................... 365/88
[58] Field of Search ........................................... 365/88

[56] References Cited

U.S. PATENT DOCUMENTS 3,562,722  2/1971  Jauvtis ................... 365/88
3,997,884  12/1976  Battarel et al. ......... 365/88

Primary Examiner—James W. Moffitt
Attorney, Agent, or Firm—Holman & Stern

[57] ABSTRACT

A magnetic domain propagation register carrying out the propagation of the domains under the effect of electric currents, comprising an insulating substrate, a soft magnetic layer on the insulating substrate, in which is formed a propagation channel, a hard magnetic layer on the soft magnetic layer, except in areas defining the propagation channel, an insulating layer on the soft and hard magnetic layers, and a conduction layer in a Greek border pattern on the insulating layer, constituted by parallel segments perpendicular to the propagation channel, the propagation channel comprising widened boxes at the intersection of the propagation channel with the segments of the conduction layer.

3 Claims, 4 Drawing Figures

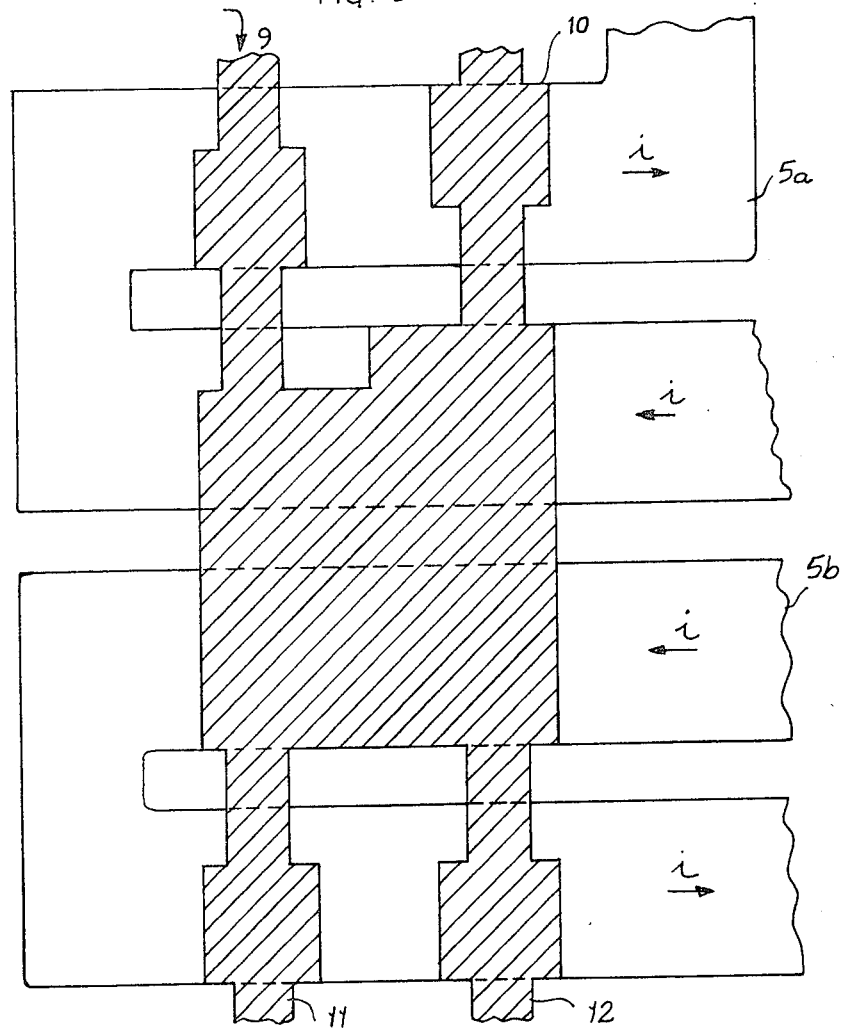
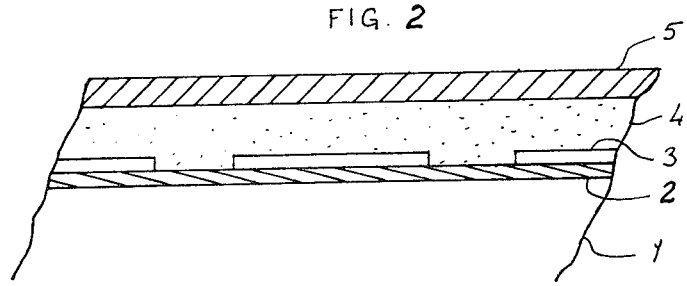

MAGNETIC DOMAIN PROPAGATION REGISTER

BACKGROUND OF THE INVENTION

The present invention relates to a storage register for propagating magnetic domains in a thin ferromagnetic layer, where the magnetization remains in the plane of the layer, comprising an insulating substrate, a soft magnetic layer overlying the insulating substrate, in which is formed the propagation channel, a hard magnetic layer overlying the soft magnetic layer, except in the areas defining the propagation channel, an insulating layer overlying the soft and hard magnetic layers, and at least one conduction layer in a Greek border pattern overlying the insulating layer, constituted by parallel segments perpendicular to the propagation channel, the propagation channel comprising widened boxes.

SUMMARY OF THE INVENTION

In known devices of this type, such as described in U.S. Pat. Nos. 3,997,885 and 4,124,901, a single conductor allows the propagation of the domains, but strips of hard magnetic layer must be associated with this conductor and complicate manufacture thereof.

The invention enables this drawback to be avoided, by providing a single conductor ensuring the unilateral propagation of the domains without necessitating association with a hard magnetic strip.

To this end, the invention relates to a register of the above-mentioned type, wherein the widened boxes of the propagation channel are located at the intersections of the propagation channel with the segments of the conduction layer.

The magnetostatic fields necessary for performing the above functions are set up by the widened and localised boxes of the channel, this further allowing a finer definition of these fields, and in particular a reduction in the dimensions, whilst conserving a fairly broad tolerance on the thickness of the insulating layer and on the geometrical definition of the conductor.

The widened boxes of the channel act on the domains by the magnetostatic charges (or poles) which spontaneously develop at a discontinuity of the magnetization of a hard magnetic layer.

There is an effect of integration of these charges and, consequently, the form of the enlargement is of little importance. For example, rectangular enlargements with more or less rounded angles are perfectly suitable. The hard layer mentioned above is that which is deposited directly on the soft base layer and of which the open zones, for example preserved by an exposed and developed photosensitive resin, constitute the domain propagation channels in the soft base layer.

Storage densities at least equal to 200 000 bits per cm$^2$ are possible with propagation channels of a few microns width, for example 4 microns, made from conventional photolithographic processes. Parallel channels may be connected, this allowing the production of registers of various lengths. The structure easily lends itself to the production of registers on a portion of silicon already carrying, before the deposit of the magnetic layers, the access integrated circuits: decoding circuits, generator of shift and read-in currents and read-out amplifiers.

BRIEF DESCRIPTION OF THE DRAWINGS

The invention will be more readily understood on reading the following description with reference to the accompanying drawings, in which:

FIG. 2 is a view, partially in section, of the register of FIG. 1 along line II—II;

FIG. 3 shows a different embodiment of the register of FIG. 1;

DETAILED DESCRIPTION OF PREFERRED EMBODIMENTS

Figure 1:
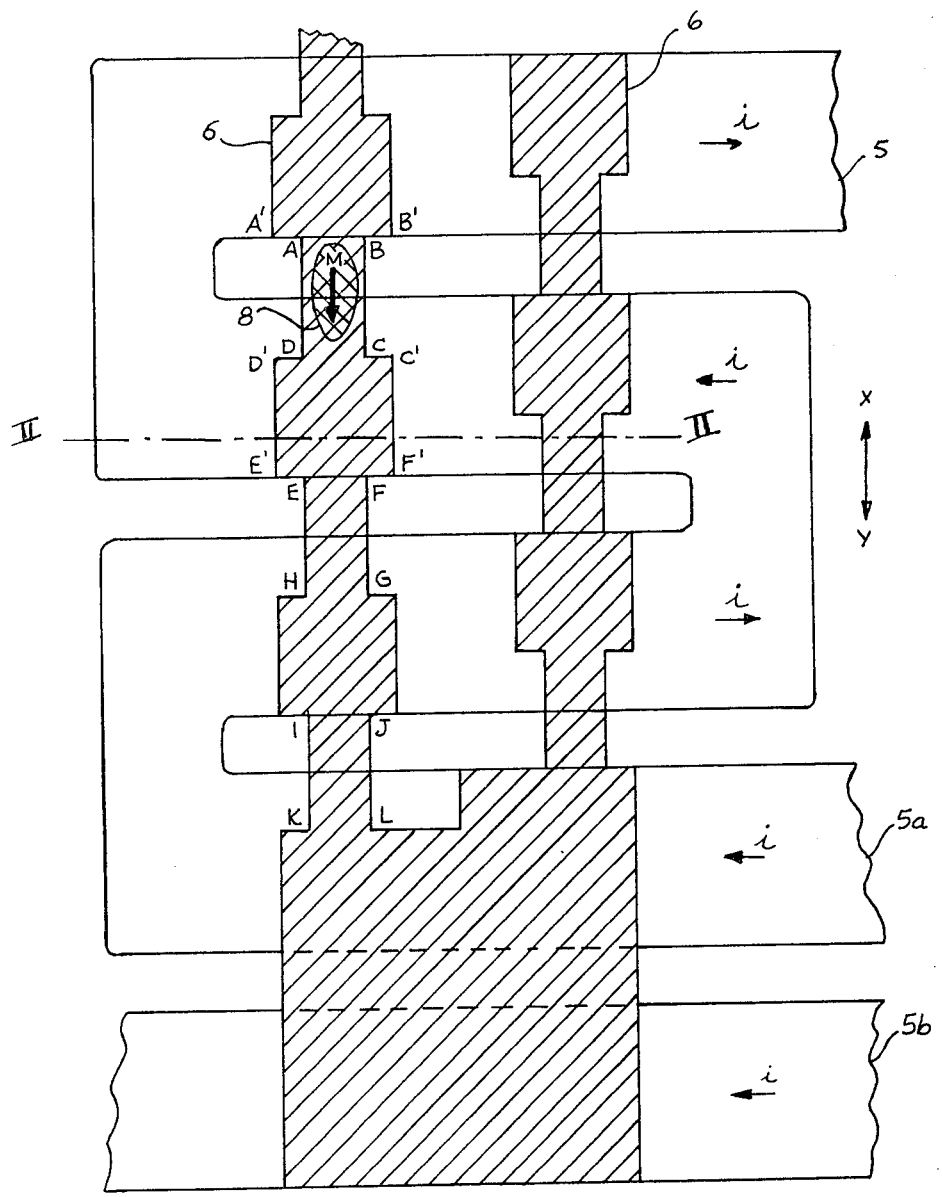
FIG. 1 shows a fraction of the register with the domain propagation channel and the shift conductor in a Greek border pattern.

Referring now to the drawings, FIGS. 1 and 2 illustrate the structure of a fraction of the register of the invention, with a connecting zone of two parallel segments of the domain propagation channel. In the sectional view of such a structure (FIG. 2), the following are successively observed:

a substrate 1 made of glass (or other material with specular surface), a soft magnetic layer 2 having uniaxial anisotropy, with typical characteristics as follows:

| coercitive field | : $H_c$ = 1 to 2 oersteds |
|---|---|
| anisotropy field | : $H_k$ = 30 oersteds. |

For example, a layer of NiCoB having a thickness of 700 to 1000 Å, deposited by a wet chemical process without current, or a layer of NiFeCo of the same thickness, evaporated in vacuo, may suit, a hard magnetic layer 3, of coercitive field of more than 500 oersteds and of a thickness of 500 to 1000 Å, deposited in intimate contact with the soft layer 2 such as, for example, a layer of CoP deposited by chemical process after having reserved the channel areas by a light-sensitive resin exposed through a mask, and then developed according to known processes.

The intimate contact of the two magnetic layers is essential to obtain a good coupling by exchange.

Outside the channels, where the soft layer 2 alone is present, everything occurs as if the hard layer 3 were present alone and the soft layer 2 did not exist, since, when a hard magnetic layer and a soft magnetic layer are located in parallel planes which are very close to each other, at a zero or virtually zero distance, the soft layer acts in practice as a hard layer of which the magnetization is in the same direction as that of the hard layer.

However, this is true only if the assembly of the coupled layers is subjected only to magnetizing fields whose value is lower than a certain threshold, 40 oersteds in the present case.

Above this threshold, the soft layer ceases to be coupled to the hard layer, it commutates and, if the magnetizing field is of a direction inverse of that of the field of the hard layer, the soft layer is magnetized in the direction inverse of that of the hard layer.

As the fields applied by the shift conductor are always clearly lower than the commutation threshold, no domain can be formed in the coupled layer; the domains can appear only in the channels where the soft layer is the only existing one, an insulating layer 4 and a layer 5 of conductors, separated from the layer 3 by the insulating layer 4, in a Greek border pattern.

The insulating layer 4 is of any type, but is preferably with low dielectric coefficient, and it must allow the adherence of the metal layers whilst reducing the stresses on the magnetic layer. A polyimide applied by a whirler and polymerised at about 150° C. is particularly suitable for thicknesses of the order of 5 microns and more. For very small dimensions, a smaller thickness, of the order of 2 microns, may be desired, and other insulating agents such as another thermostable polyimide, a strongly polymerised photoresist or even a non-organic layer such as silica deposited at low temperature may be preferable.

The conductor 5 is relatively thick in order to reduce its resistance. For example, this conductor is deposited in the following manner:

(a) deposit of chemical copper without current, uniform and of small thickness, about 1 Å;

(b) deposit by a whirler of a photosensitive resin exposed to UV rays through a mask and developed;

(c) deposit of electrolytic copper of 5 to 10 microns thickness;

(d) thin deposit of gold for protection;

(e) dissolution of the resin and thin, interstitial, chemical copper.

FIG. 1 shows a plan view of the register, the hatched zones 6 constituting the propagation channel which comprises periodic widened boxes, located at the intersections of the propagation channel 6 with the segments of the conduction layer 5. These boxes are substantially in the form of a rectangle of which one of the sides A'B', E'F' parallel to the segments of the conduction layer, is disposed substantially along the downstream edge, with respect to the direction of domain propagation, of one of said segments, the length of the sides of the rectangle, D'E', perpendicular to these segments being shorter than the width of the segment in question.

Let us suppose a domain such as 8 in FIG. 1, constituted by an approximately ellipsoidal zone of magnetization anti-parallel to the general direction of the magnetization in the soft and hard layers, parallel to a direction of the easy axis XY in the soft layer.

When a current i circulates in the conductor 5, a magnetic field parallel to the magnetization in the domain results and said latter grows in length beneath the conductor, as for as the downstream part of the zone of the channel EFGH. When the current ceases, the initial part of the domain is deleted in the zone CDEF due to the demagnetizing field created by the widened boxes of the channel. In fact, the magnetostatic charges existing at the edges CC', DD', EE', FF' of the widened boxes of the channel create a magnetic field tending to delete the domain from zone C', D', E', F' and to cause it to grow in the zones ABCD and EFGH.

The initial domain is therefore separated in two domains located in ABCD and in EFGH.

The current in the conductor 5 is then inverted and a current i circulates in this conductor. The domain located in ABCD being mainly engaged beneath the segment of conductor where the current i creates a field of deletion, will be deleted. On the contrary, the domain located in EFGH is mainly engaged beneath the adjacent segment of conductor where the current i creates a growth field and, similarly to the preceding alternation, the domain will separate into two domains in EFGH and IJKL. The data is translated in the downstream direction by a distance corresponding to the step of the segments of conductor at each alternation of the control current. This is therefore a shift register operation.

At the following alternation, the current i circulating in the same direction in the two segments of conductor 5a and 5b shown at the bottom of FIG. 1, a field of growth is applied to all the large zone constituting the connecting zone of the channel and a domain will fill this zone. This widened connecting bend zone is substantially in the form of a rectangle, of which the side perpendicular to the propagation channel and remote from the upstream segment of propagation channel, to the left in FIG. 1, disposed beneath the conduction layer of the segment 5a, extends along the edge, remote from segment 5a, of the segment 5b adjacent the segment 5a, the length of a first side, to the left in the FIG. 1, of the rectangle, parallel to the propagation channel and connected to the upstream segment of this channel, being shorter than the distance separating the two remote edges of the two segments 5a and 5b, and the length of the second side of the rectangle parallel to the propagation channel being equal to this distance.

The propagation will then continue in the right-hand leg of the channel, towards the top in the FIG. 1, similarly to the propagation of the domains which has just been described in the left-hand leg, towards the bottom. The propagation channels of the invention may therefore be connected and enable registers to be made in any length, not exceeding the maximum number of bits per square centimeter on the available surface of the substrate in question.

FIG. 3 shows a connection of which the geometry and operating are similar to a connecting portion of the channel, to which are connected an upstream segment of propagation channel and a plurality of downstream propagation channel segments, with respect to the direction of domain propagation. This connection allows the data to separate synchronously in a plurality of channels.

In fact, a domain which arrives at 9 will propagate towards three synchronous outputs, one upwards at 10 and two others downwards at 11 and 12.

The read-in and read-out members may be of any type; in particular, known means which have already been described in the patents mentioned hereinabove, may be used.

Figure 4:
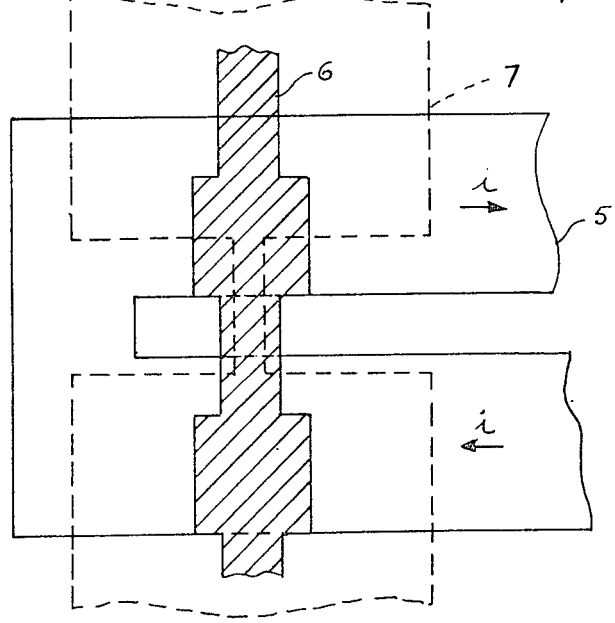
FIG. 4 is a view illustrating the read-in in the register of the invention.

FIG. 4 illustrates by way of example a read-in by coincidence of a current in the shift conductor and a read-in conductor 7 which is at right angles thereto and more narrow in the zones between two adjacent segments of the shift conductor.

Read-out may be effected by a variation of flux in a large zone of channel where by the coincidence of a plurality of channel zones, domains arrive synchronously, when the or each domain grows beneath a read-out conductor, preferably multi-turn to collect a greater electromotive force $e = d\phi/dt$, where $\phi$ is the leakage flux of the points of domains, intersected by the read-out conductor.

Figure 5:
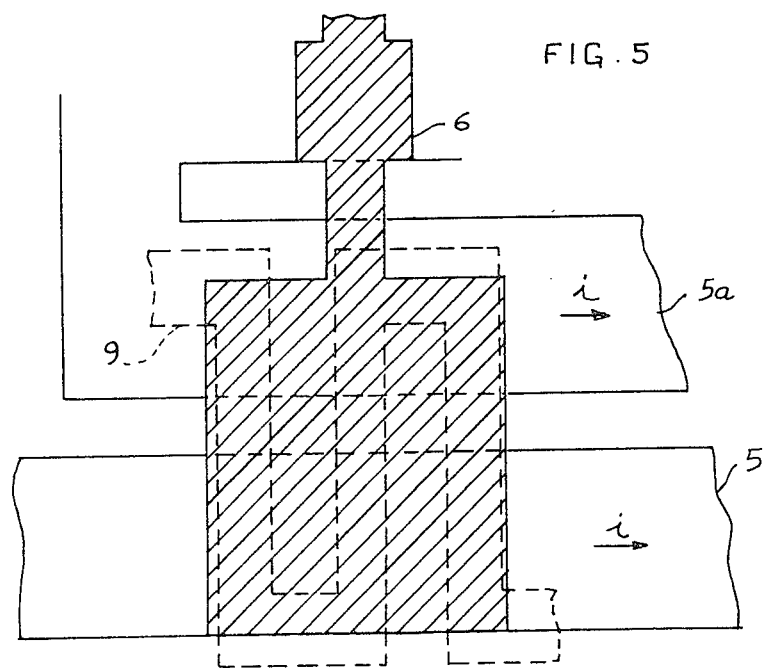
FIG. 5 is a view illustrating the read-out of the register of the invention.

Read-out may also be effected by an effect of magneto-resistance, as illustrated in FIG. 5, where a multi-segment strip 9 of NiFe 85/16 is influenced by the leakage field of the domain.

In particular, the read-out division may be widened and will enable a longer magnetoresistive strip to be placed. In this case, the input channel will be extended to avoid the interactions of the upper edge of the read-out box. A signal of B 2 mV may be obtained with a strip with 12 segments 60 microns long, 4 microns wide and 2500 Å thick, energized by a current of 6 mA, placed above or below a read-out box of 70×100 microns.

The device forming the subject matter of the invention enables shift registers for magnetic domain propagation memories to be obtained, which are simplified, i.e. requiring only one conductor to ensure unilateral propagation of the domains and enabling a high density of data to be stored.

I claim:

1. A storage register for propagating magnetic domains in a propagation channel comprising an insulating substrate, a soft magnetic layer overlying the insulating substrate, in which is formed the propagation channel, a hard magnetic layer overlying the soft magnetic layer, except in the areas defining the propagation channel, an insulating layer overlying the soft and hard magnetic layers and at least one conduction layer in a Greek border pattern overlying the insulating layer, constituted by parallel segments perpendicular to the propagation channel, the propagation channel comprising widened boxes, characterized in that the widened boxes of the propagation channel are located at the intersections of the propagation channel with the segments of the conduction layer;

wherein the widened boxes of the propagation channel are substantially in the form of a rectangle of which one of the sides parallel to the segments of the conduction layer is disposed along the downstream edge, with respect to the direction of propagation of the domains, of one of said segments, the length of the sides of the rectangle perpendicular to these segments being shorter than the width of the segments in question.

2. A storage register for propagating magnetic domains in a propagation channel comprising an insulating substrate, a soft magnetic layer overlying the insulating substrate, in which is formed the propagation channel, a hard magnetic layer overlying the soft magnetic layer, except in the areas defining the propagation channel, an insulating layer overlying the soft and hard magnetic layers and at least one conduction layer in a Greek border pattern overlying the insulating layer, constituted by parallel segments perpendicular to the propagation channel, the propagation channel comprising widened boxes, characterized in that the widened boxes of the propagation channel are located at the intersections of the propagation channel with the segments of the conduction layer;

wherein the propagation channel is constituted by a plurality of parallel segments, and a plurality of distinct conduction layers are provided, two adjacent segments of the propagation channel being connected by one of said widened boxes extending beneath two adjacent segments of two respective conduction layers;

wherein said widened box of the propagation channel is substantially in the form of a rectangle, of which the side perpendicular to the propagation channel and remote from the upstream propagation channel segment, disposed beneath a first conduction layer, extends along the remote edge of this first conduction layer of the adjacent segment of a second conduction layer, the length of a first side of the rectangle parallel to the propagation channel and connected to the upstream segment of this channel being shorter than the distance separating the two remote edges of the two adjacent segments from the two respective conduction layers, and the length of the second side of the rectangle parallel to the propagation channel being equal to said distance.

3. Register according to claim 2, wherein there are connected to said widened box an upstream propagation channel segment and a plurality of downstream propagation channel segments, with respect to the direction of domain propagation.

* * * * *